United States Patent [19]

Adam et al.

[11] Patent Number: 4,675,682

[45] Date of Patent: Jun. 23, 1987

[54] MAGNETOSTATIC DELAY LINE WITH IMPROVED DELAY LINEARITY

[75] Inventors: John D. Adam, Murrysville; Michael R. Daniel, Pittsburgh, both of Pa.

[73] Assignee: The United States of America as represented by the Secretary of the Air Force, Washington, D.C.

[21] Appl. No.: 662,204

[22] Filed: Oct. 18, 1984

[51] Int. Cl.[4] .............................................. H01Q 3/22
[52] U.S. Cl. .................................... 342/375; 333/147; 333/148
[58] Field of Search ................. 343/375; 333/147, 148

[56] References Cited

U.S. PATENT DOCUMENTS

| | | | |
|---|---|---|---|
| 4,199,737 | 4/1980 | Patterson et al. | 333/154 |
| 4,314,214 | 2/1982 | Castera et al. | 333/141 |
| 4,316,162 | 2/1982 | Volluet et al. | 333/201 |
| 4,341,998 | 7/1982 | Castera et al. | 324/244 |
| 4,544,927 | 10/1985 | Kurth et al. | 343/375 |

OTHER PUBLICATIONS

John D. Adam et al., "MSW Variable Time-Delay Techniques", Interim Report, RADC TR-82-206, Jul. 1982.

J. D. Adam, M. R. Daniel, P. R. Emtage and R. W. Weinert "MSW Variable Time-Delay Techniques", RADC TR-83-139, Final Report, Nov. 19, 1982.

*Primary Examiner*—Theodore M. Blum
*Attorney, Agent, or Firm*—Gerald B. Hollins; Donald J. Singer

[57] ABSTRACT

An arrangement for improving the frequency plane delay linearity of a frequency dispersive delay line of the type employing ferrite film materials such as yttrium iron garnet. Linearity improvement involves use of frequency selective transducers located at successively different delay locations in the transmitting and receiving areas of the delay line together with ground plane effects and out of phase signal coupling to the transducer elements including exemplary use of a particular type of microwave transmission line for coupling to the magnetic film.

16 Claims, 9 Drawing Figures

MAGNETOSTATIC DELAY LINE WITH IMPROVED DELAY LINEARITY

RIGHTS OF THE GOVERNMENT

The invention described herein may be manufactured and used by or for the Government of the United States for all governmental purposes without the payment of any royalty.

BACKGROUND OF THE INVENTION

This invention relates to the field of electrical signal delay lines wherein signal delay is accomplished by the propagating of a radio frequency signal through a ferrimagnetic film such as a magnetic garnet including the electrical-to-magnetic transducers used with such delay lines.

Magnetostatic wave delay lines are potentially useful in phased-array radar antennas because of the wide instantaneous bandwidth obtained when time delay rather than phase shift is used for beam steering. For example, most present-day phased array radar antennas use 0 to $2\pi$ phase shifters for beam steering and thereby achieve a beam angle of $$\theta = \sin^{-1}(\psi c/2\pi s f), \quad (1)$$

an angle which is frequency dependent. In Equation (1) $\psi$ represents the phase shift increment between elements, c is the velocity of light, f is the frequency, and s is the spacing between antenna elements. It is the relationship of the beam angle ($\theta$) with frequency which results in the narrow, instantaneous bandwidth of such present-day phased array antennas. If, however, variable time delay devices such as a magnetostatic delay line are used to steer the antenna, the beam steering angle is $$\theta = \sin^{-1}(tc/s), \quad (2)$$

an angle which is independent of frequency. In Equation (2) t represents the incremental time delay between array elements and the other parameters are as described for equation (1). Thus, using time delay beam steering, the instantaneous bandwidth of the antenna is only limited by the bandwidth of the delay lines or other microwave components and will typically be in the range of 300 to 1000 MHz. The time delay variation required for a particular antenna element depends upon the antenna structure and is typically ±10 ns for a 12 foot aperture. This relationship is discussed in detail in books on radar systems design.

Adjustable delay lines, whose characteristics do not vary with frequency can be obtained by combining an "up-chirp" delay line with a "down-chirp" delay line so that the achieved total delay is constant with frequency. An "up-chirp" delay line has a group delay which increases linearly with frequency. Delay adjustment is therefore achieved by changing the center frequency of one of the delay lines. This frequency change can be achieved for example by varying the strength of the applied magnetic bias field as is described in the copending patent application of K. K. Jin, docket number AF 15274 Ser. No. 06/664,193, filed Oct. 24, 1984.

Dispersive magnetostatic wave (MSW) delay lines also find use in broadband compressive radio receivers for electronic warfare applications. In a compressive receiver, signals within the system bandwidth are mixed with a linear FM chirp, i.e., a signal whose frequency varies linearly with time, and are passed into a dispersive delay line whose delay variation with frequency matches that of the FM chirp. The output of the delay line then effectively provides the Fourier transform of the input signal. A device of this type is actually a very high-speed, boardband spectrum analyzer. Since MSW delay lines have bandwidths in the 500 MHz to 1 GHz range, wide frequency ranges can be covered with a few devices.

Practical uses of the magnetostatic delay line require that the dispersive delay-frequency characteristics of the device be predictable according to some mathematical relationship. Preferably this mathematical relaionship should be a linear first-order equation wherein frequency and delay are correlated by a straight line graphical relationship.

Several MSW delay line techniques have been developed which result in an approximately linear variation of delay with frequency. However, in each of these techniques there is always present a predictable delay error of deviation from the desired linear delay variation with frequency. In particular, two simple delay line techniques have been demonstrated which each show such a linear variation of delay with frequency over a 1 GHz bandwidth, however, each of these techniques also demonstrates a slow "W" shaped delay error characteristic. One of these techniques involves a ground plane spaced from the Yttrium Iron Garnet (YIG) magnetic film of the delay line element a plane spaced by a distance equal to the film thickness. The second technique involves two YIG films of generally equal thickness spaced apart by a non-magnetic layer. These delay lines represent structurally simple techniques, however their usefulness is limited by residual phase error—even though this phase error is predictable and can in principle be compensated for. In the present document a technique is described which may be used in conjunction with these simple delay line structures in order to compensate for the delay error.

Figure 4:
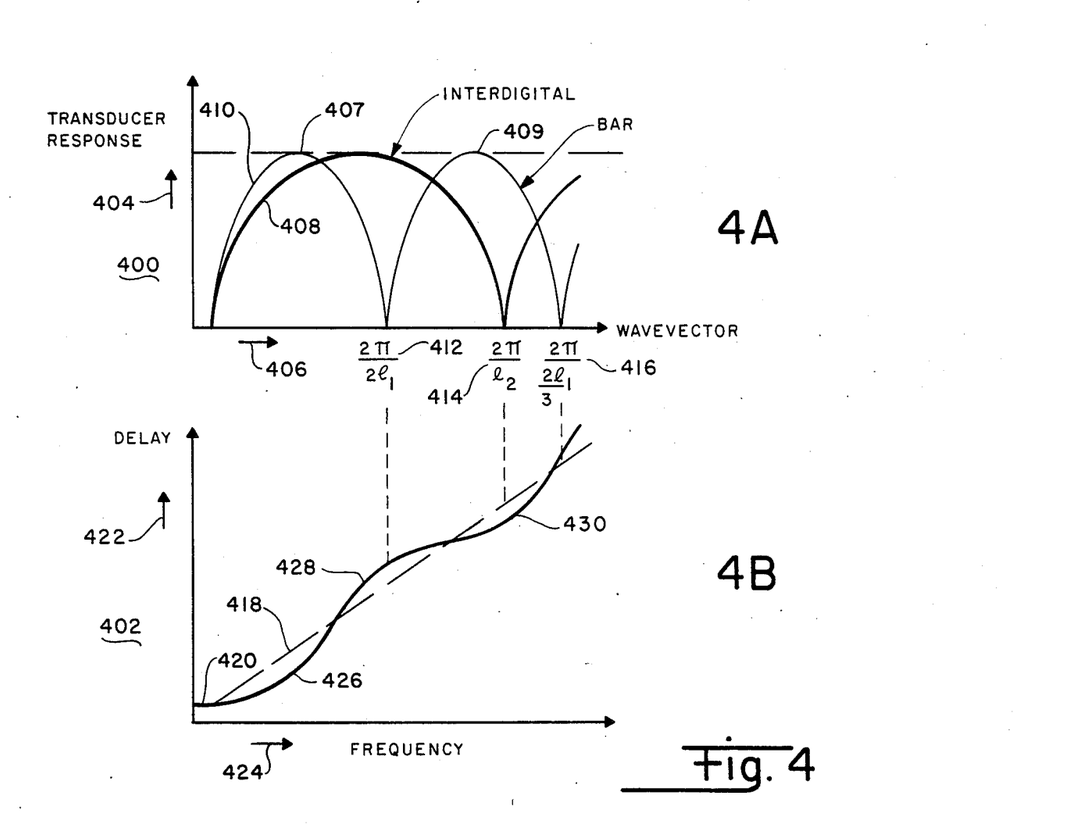
FIG. 4 describes in two views, FIGS. 4A and 4B, the frequency, delay, and amplitude responses for the FIGS. 2 and 3 transducer arrangements.

The patent art includes several examples of magnetostatic delay line devices; these examples include a first patent of Jean P. Castera, U.S. Pat. No. 4,341,998 which concerns a magnetometer apparatus fabricated with a magnetostatic device that is connected into an oscillator circuit. One view of the Castera magnetometer, in FIG. 4, shows tranducers with multiple elements that are excited by a common signal. This FIG. 4 device employs resonant cavities in the form of grooves but the employed transducers are devoid of different element types and locations used in combination.

The patent of Gerard Volluet, U.S. Pat. No. 4,316,162, describes a magnetostatic wave device, such as a delay line, which has transmitting and receiving transducer elements in the form of thread-like filamentary electrodes. The Volluet apparatus includes magnetic wave attenuating regions formed in the ferrimagnetic garnet magnetic layer by an abrading technique such as sand blasting. The Volluet patent discloses only the simple single filament transducer element and is principally concerned with reduction of interference reflections within the magnetic garnet material on which the transducers are mounted.

A second patent of J. P. Castera et al U.S. Pat. No. 4,314,214, discloses a magnetostatic wave device which may be composed of a ferrimagnetic layer of yttrium iron garnet that is subjected to a polarizing magnetic field. On the Castera garnet layer are mounted transmitting and receiving transducer elements and an exchange structure which serves to receive and retransmit signals originating in the transmitting transducer. The exchange structure is formed by a plurality of transducer elements, spaced by less than half a magnetostatic wavelength, which are connected to form a complete electrical circuit. The exchange structure of the Castera patent is used for wide band signal coupling, a magic T device and for several multi-plane signal coupling arrangements. The Castera invention is concerned with re-transmission of an original transducer signal and with the optimizing of device performance using this retransmitted signal in combination with quarter-wave displacement of the exchange structure elements and tuning of the circuit elements. One transducer disclosed in the Castera patent, the transducer 27 in FIG. 8 includes multiple elements of unequal length which are fed by a single source of signal. None of the embodiments of the Castera patent, however, are concerned with a combination of bar and interdigital transducer elements in a magnetostatic wave device.

Another example of prior art magnetostatic wave device is found in the patent of Ralph W. Patterson et al, U.S. Pat. No. 4,199,737 which includes a common inventor with the present invention but is assigned to a different assignee than the present patent. The Patterson patent concerns a magnetostatic wave device having interdigital transducer fingers fed from a common microwave source and arranged to shape the device frequency response and delay vs. frequency characteristics. FIG. 22 and the text at column 6 line 55 in the Patterson patent described a transducer arrangement employing non-uniform spacing between adjacent fingers with the spacing arranged to compensate for inherent time delay variations with changing frequency.

SUMMARY OF THE INVENTION

An object of the present invention is to provide a magnetostatic wave delay line having improved group delay linearity in the frequency domain.

Another object of the invention is to provide a magnetostatic device which employs transducers located at different delay time locations along the magnetic wave propagation path of a delay line.

Another object of the invention is to provide a magnetostatic device transducer which employs two different types of transducer elements in order to achieve a desirable combination of properties.

These objects are achieved by providing a magnetostatic delay line having improved delay vs. frequency response characteristics as a result of combining an elongated magnetic garnet crystal film with a pair of transmitting and receiving transducer members located on one film surface near the ends of the crystal member with one or more of the transducers including a combination of interdigital and bar elements and wherein the crystal body member is subjected to a magnetic bias flux and is located near a conductive ground plane member.

DETAILED DESCRIPTION

Figure 1:
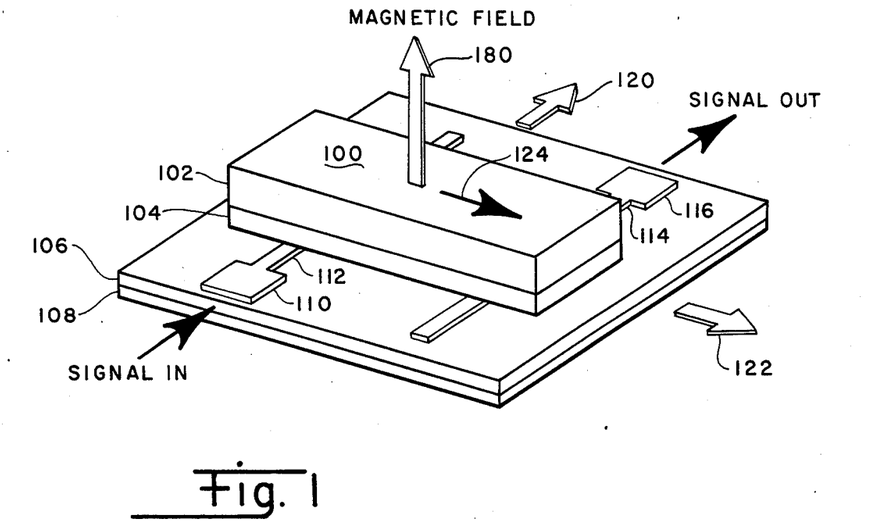
FIG. 1 is an overall view of a magnetostatic delay line.

FIG. 1 shows an overall view of a magnetostatic delay line 100 together with some of the attending apparatus used in operating the delay line. The delay line 100 includes a substrate member 102 and a magnetostatic film layer 104 which are joined together in a single integral unit. The layer 104 is fabricated from a ferrimagnetic film of such material as yttrium iron garnet (YIG), that is capable of propagating magnetic energy in wave form. The substrate member 102 in FIG. 1 may be fabricated from gadolinium gallium garnet (GGG) or a similar material and has a polished surface for receiving the yttrium iron garnet (YIG) film layer during a process such as epitaxial growing or other fabrication techniques which are known in the art. The sides, ends and other portions of the YIG layer 104 may be shaped and treated according to techniques which are known in the art to minimize reflections and otherwise improve the properties of the delay line 100.

Signals are applied and removed from the delay line 100 by way of transmission line transducers 112 and 114 which are coupled to bonding pads or other termination arrangements indicated generally at 110 and 116. Additional details concerning the transmission line transducers 112 and 114 are described below. Signal in the form of magnetic waves of energy is transmitted between the input transducer 112 and the output transducer 114 as indicated by the arrow 124.

Attending both the delay line 100 and the transducers 112 and 114 is an electrically conductive ground plane member 108 which is removed from the transducers 112 and 114 and the layer 104 by a separating layer of insulating material 106 which may be comprised of alumina. $Al_2O_3$, or other such materials which are known in the art. The ground plane 108 serves as both an integral part of the transmission line transducers 112 and 114 and as an integral part of the delay line 100 in the manner which is described below. The transducers 112 and 114 are preferably of the type referred to in the transmission line art as microstrip lines.

A polarizing magnetic field—in the direction of the arrows 180, 120 or 122 is necessary in the FIG. 1 delay line in order to achieve propagation of the magnetostatic waves in the YIG film layer 104. This magnetic field can be conveniently supplied by a permanent magnet or electromagnet device of the type known in the art and which is not shown in FIG. 1. The orientation of the magnetic field of this magnetic device with respect to the delay line 100 determines which of three possible types of magnetic waves are established in the film 104. If the magnetic field is in a direction parallel to the surface of the film 104 and in the direction of signal travel, that is, in the direction of the arrow 122 in FIG. 1 then the film layer 104 propagates so-called bulk backward magnetostatic waves. If the magnetic field is in the plane of the film 104 but directed across the direction of signal travel, that is, in the direction of the arrow 120 in FIG. 1, then the layer 104 propagates so-called surface magnetostatic waves. Finally, if the polarizing magnetic field is in the direction of the arrow 180, perpendicular to the surface of the film layer 104, then the film layer 104 propagates so-called bulk forward magnetostatic waves.

The characteristics of the delay line 100 depend upon which of these three types of magnetostatic wave propagation are present; some characteristics such as the linearity of the delay vs. frequency relationship and the effect of ground plane to ferrimagnetic layer spacing variations differ significantly among these three types of propagation. The transducers used at 112 and 114 in the FIG. 1 delay line and the delay compensation achieved therein as described below are similar for each of these three types of wave propagation and differ generally with respect to quantitative considerations.

Delay lines of the FIG. 1 type are often thought of as the magnetic analog of the familiar acoustic wave delay line which is used at lower frequencies. Generally, delay lines of the FIG. 1 type are employed at microwave frequencies and provide delays in the order of a few hundred nanoseconds with power antenuations in the order of 10 dB. As mentioned earlier, delay lines of this type find particular application in the fields of signal processing and antenna feeding and directivity changes; uses are not limited to these applications, however.

It should be realized that even though the present description employs the structure shown in FIG. 1 wherein one pair of transducers 112 and 114 are coupled to a single layer MSW device, the concepts described can also be applied to multiple layer arrangements wherein two or more MSW devices located in a sandwich structure are coupled to the same transducers. Such a structure in two-layer form might, for example, be fabricated from two YIG layers that are separated by a GGG layer and covered by a top GGG layer. Third and additional layers of YIG material may also be used in such structures. Transducers of the character described herein may be employed at the transmitting and receiving ends of such a multiple-layer structure.

In any use of the FIG. 1 delay line, it is desirable for the attained signal delay to have a known and predictable relationship to delay line parameters. For delay lines which are dispersive in nature, that is, lines having a signal delay which is a function of the input signal frequency, it is desired for the attained signal delay to be linearly related to the input frequency, a relationship indicated by the dotted line 418 in FIG. 4 of the drawings.

Figure 5:
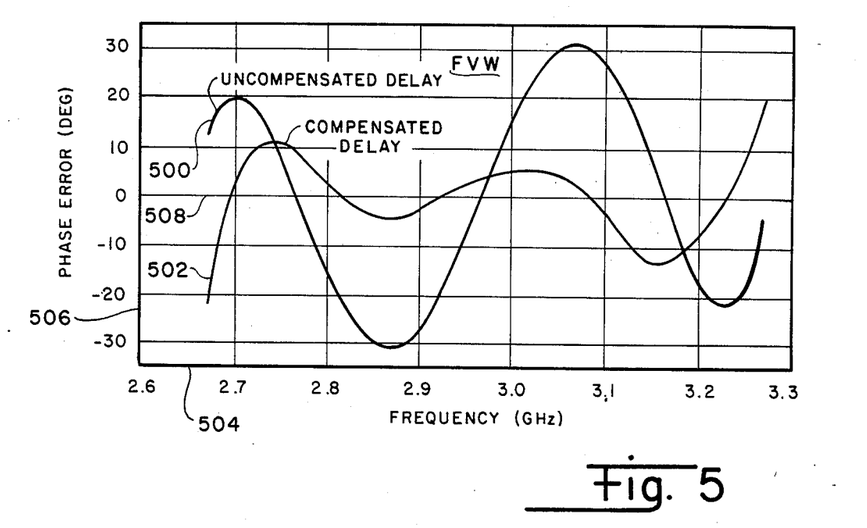
FIG. 5 shows a frequency vs. phase error plate for both an uncompensated and compensated delay line.
Figure 6:
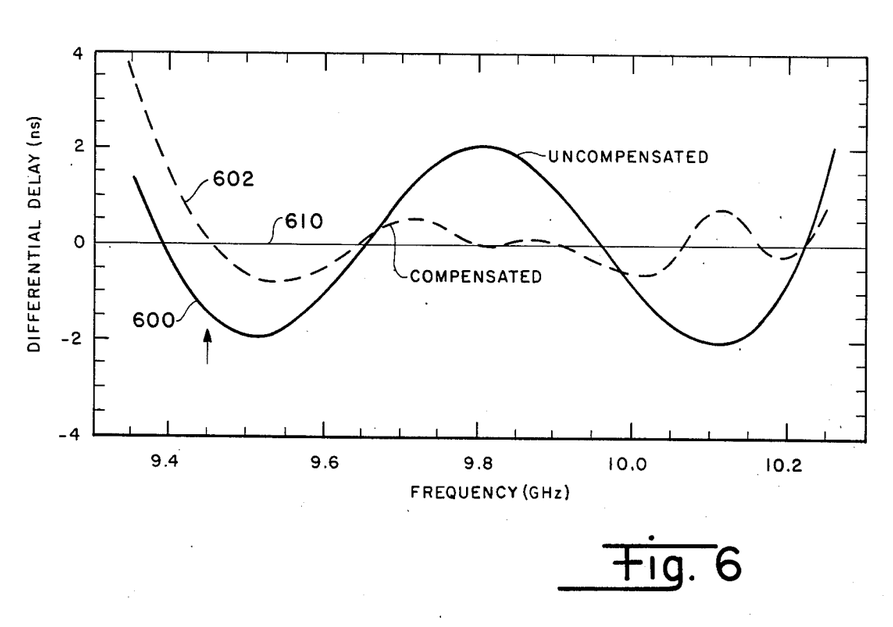
FIG. 6 shows a frequency vs. delay plot for both a compensated and an uncompensated magnetostatic delay line.

As was mentioned above, complexities attending the propagation of magnetic wave energy in the film layer 104 cause the attained signal delay from a delay line of the FIG.1 type to depart from a desired linear relationship according to a predictable slow W or slow shaped S relationship; this departure is conceptually indicated by the line 420 in FIG. 4B and the plot 600 in FIG. 6. These imperfections also provide a distortion of the desired quadratic phase relationship with frequency as indicated by the plot 500 in FIG. 5.

According to the present invention, these imperfections in the relationship between signal delay and signal frequency, that is imperfections in the delay characteristics observed in the frequency plane, may be improved upon by modification of the usually employed delay line transducers indicated at 112 and 114 in FIG. 1. A typical arrangement for transducers capable of providing such delay correction or delay linearizing is shown in FIG. 2 of the drawings.

Figure 2:
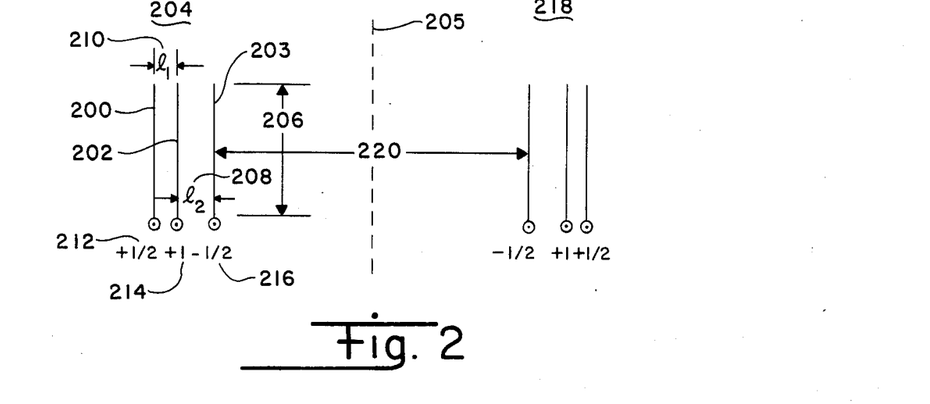
FIG. 2 shows details of transducers usable with the FIG. 1 delay line.

FIG. 2 illustrates a pair of transducer arrays 204 and 218 such as might be employed at the transmitting and receiving ends of the delay line 100 in FIG. 1 at 112 and 114, respectively. It is presumed in FIG. 2 that a delay line of the magnetostatic type is coupled to the arrays 204 and 218, however this delay line is not shown in FIG. 2. The illustrated transmitting and receiving arrays 205 and 218 are symmetrical about a center line 204 which is located halfway between the transmitting and receiving arrays. Symmetry of this type between the transducers of a delay line is convenient for describing the arrays 204 and 218 and for some embodiments of the invention however such symmetry is not essential and moreover is expressly avoided in some arrangements of the invention.

The transducer array 204 is shown to include transducer elements 200, 202, and 203 which are spaced apart by the dimensions L1, 210 and L2, 208 and are of length 206. The elements of the transducer array 204 are fed with signal having the phase-amplitude relationships shown at 212, 214 and 216 in FIG. 2. The transmitting and receiving arrays 204 and 218 are shown to be separated by a propagation distance 220 in FIG. 2.

Each of the transducer arrays 204 and 218 in FIG. 2 may be described as a combination of bar and interdigital transducer elements. In accordance with this description, the term bar transducer elements relates to one or more elements which are spaced according to a first wavelength relationship and fed with the same signal while the term "interdigital transducer elements" elements relates to elements which are spaced according to a second wavelength relationship and fed with signal of differing phase and/or amplitude. Essentially the transducer array elements 200–203 are comprised of electrical conductors of precisely selected separation, length, width and thickness dimensions in the transducer elements per se and in the transducer element feed conductors—in order that the transducer elements and array be frequency tuned as indicated in FIG. 4.

The establishment of magnetic waves in the film layer 104 is accomplished by current flow in the transducer elements 200, 202, and 203. In the form of transducers indicated in FIG. 2, this current flow is achieved with open end conductors which act as radiators, and also in response to capacitance relationships—both in order that current flow in the individual elements occur. In the FIG. 2 open-ended form of conductors, each conductor is preferably arranged to be one one-half electromagnetic wavelength or some odd number of half-wavelengths at length dimension 206 in order that maximum current coupling occur near the center of the element and a node of zero current appear at the open element end. Preferably a length of one-half electromagnetic wavelength is used. In an alternate arrangement of magnetostatic transducer elements it is also possible to make the individual elements part of a closed-loop circuit wherein current flow is achieved around the loop, e.g., with one end of the transducer elements connected to ground; length dimensions other than one-half wavelength at 206 are also feasible.

Especially in connection with the illustrated open end arrangement for the transducer elements 200–203, it should be realized that the transducer 204 operates in association with the ground plane member 108 in FIG. 1 and that excitation at microwave radio frequencies is employed so that ground plane effects on the transducer elements are present in addition to the delay line ground plane effects. The ground plane 108 in FIG. 1 is therefore properly regarded as both an element of the transducers 204 and 218 as well as an element of the delay line 100. It should be noted that the presence of a ground plane in the FIG. 1 delay line arrangement may cause attenuation of the magnetostatic wave, as a result of eddy current damping, and that one or more ground planes are always present in a practical delay line environment since the delay line is contained within a metal box or some other mounting structure.

Figure 3:
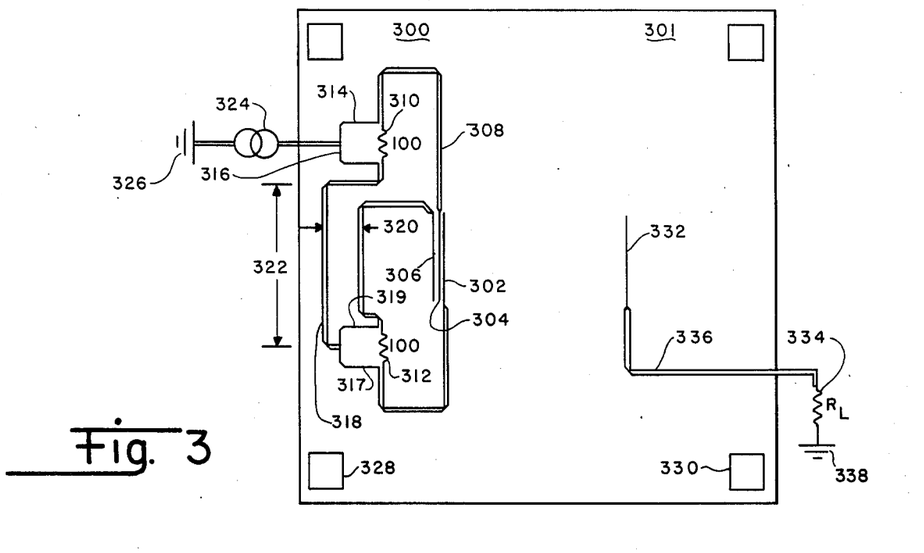
FIG. 3 provides additional details of the FIG. 1 transducers in the form of a photographic mask.

It should also be realized that the FIG. 2 element configuration is symbolic in nature and that an actual transducer element arrangement may be more in accordance with FIG. 3 of the drawings. The FIG. 2 transducer elements 200-203 may be fabricated in the form of microwave strip lines, the term strip line being known in the microwave integrated circuit art and implying inter alia an arrangement of microwave transmission line elements together with an associated ground plane which may be used for microwave signal transmission and radiation purposes.

As will be explained in connection with FIG. 4 below, the careful selection of transducer element frequency response is used as a mechanism for smoothing the delay line frequency vs. delay characteristics in the present invention. Within the transducer 204 the overall transducer frequency response is determined by the physical dimensions of the transducer elements 200-203. The length or separation spacings 208 and 210 are especially sensitive and controlling of this frequency response once a given configuration of transducer elements has been selected. In particular, the interdigital pair of transducer elements 202 and 203 are most efficient in generating magnetic film waves when the spacing L2, 208 is one-half or some odd number multiple of one-half of a wavelength of the magnetostatic wave energy. In similar fashion, the bar transducer elements 200 and 202 are most efficient in generating magnetic waves when the separation L1, 210 is equal to one or more integral wavelengths of the magnetic wave energy. Preferably spacings of one-half and one wavelength respectively are used for these spacings.

The double use of the element 202 as part of the interdigital pair and part of the bar transducer pair should be noted in this description. The double amplitude or +1 signal applied to the element 202 as shown at 214 is in keeping with this double element use. The element 202 in reality is therefore a superimposed element of signal value plus one-half as a part of the bar transducer pair 200 and 202, and also is a part of the interdigital transducer pair 202 and 203 thereby receiving an additional amplitude of plus one-half. The out-of-phase signal applied to the transducer element 203 is indicated by the value of $-\frac{1}{2}$ at 216 while the in-phase signal of amplitude $+\frac{1}{2}$ applied to the bar element 202 is indicated at 212.

The fact that separation between the transducer elements in the transducer 204 allows precise control over the frequency response of these elements enables the tuning or refining of the delay line frequency response in the present invention.

A further aspect of the invention involves the concept that the propagation distance 220, over which magnetic waves travel between transducers 204 and 218, differs for the physical locations shown for the interdigital transducer pair 202 and 203 and the bar transducer pair 200 and 202; signal introduced by the bar transducer pair 200 and 202 being required to travel a longer propagation distance and thereby incur a greater delay time than does signal introduced by the interdigital transducer pair 202 and 203.

The selective combination of transducer frequency response with greater or lesser delay times according to transducer location therefore provides a set of tools which can be employed to compensate or tailor the delay line frequency vs. delay characteristics. This tailoring of the delay vs. frequency response characteristics of a delay line may be enhanced by the use of similarly arranged transducers at the receiving end of the delay line, the transducer 218 in FIG. 2. Moreover, the receiving end transducer 218 may either duplicate the frequency response of the transmitting end transducer 204 or alternately may be selected to have slightly different frequency response from that of the transmitting end transducers 24 in order that smoothing in a different frequency area of the delay line response be achieved.

An aspect of the invention which is understandable from FIG. 2, therefore, is that as the frequency under consideration changes, one pair of transducer elements becomes more efficient than the other pair. The transduction process therefore effectively shifts from one element pair to the other and thereby selects different delay times for inclusion in the overall delay time and consequently provides a desirable tailoring of the delay line response.

In FIG. 3 of the drawings, a more practical arrangement of transducers of the 204 and 218 type in FIG. 2 is shown. In FIG. 3 a transmitting transducer 300 which includes transducer elements 302, 304 and 306 is shown together with a receiving transducer 301, a source of radio frequency energy 324, and a delay line load 334. The FIG. 3 drawing originates in a photographic mask used in the integrated circuit processing of transducer elements made in accordance with the present invention. In accordance with this origin of the FIG. 3 drawing, the physical dimensions such as the length 322, the spacing 320, and the line thicknesses 308 are approximately to scale (within drafting tolerance) and the appearance of certain unneeded details in the FIG. 3 drawing, such as the photolithographic mask alignment pads 328 and 330, is explained.

The apparatus connected to the transducer elements 302-306 in FIG. 3 provide one arrangement for achieving the phase and amplitude signal values that were described above in connection with FIG. 2. This arrangement of conductors attending the transmitting transducer elements 302-306 including such details as the length and thickness of the conductors 314, 316, 318 and 308, the conductor length 322 and the presence of resistors 310 and 312 along with their indicated value of one hundred ohms are in accordance with microwave transmission line techniques which are known in the art and which have been described in a number of publications relating to microwave art. One such arrangement for these transmission line conductors that has been found particularly suitable for use in the present invention is in accordance with a pair of published articles relating to microwave signal transmission in integrated circuit devices. The first of these articles, "An N-Way Hybrid Power Divider" published by A. J. Wilkinson in the IRE Transactions on Microwave Theory and Techniques, Vol. MTT-8, page 116, January 1960, has led to the identification of the network attending the transducer elements 302-306 as a "Wilkinson Combiner". A second article describing these techniques, titled "Class of Broad-Band Three-Port TEM-Mode Hybrids", appeared in the IEEE Transactions on Microwave Theory, Vol. MTT-16, No. 2, Page 110, in February 1968; this article was written by Seymour B. Cohn.

As is described in these articles, the different conductor thicknesses, evident between the conductors 316 and 318, together with the positioning and length of the conductors, and the removal of signal from the top and bottom nodes of the resistor 310 are effective in determining the phase relationship and the amplitude of the signals applied to the delay line elements 302-306. In particular, it is to be noted that the out-of-phase element 302 which corresponds to the out-of-phase element 203 in FIG. 2, is fed from the bottom side of the transformer which is comprised of the conductors 317 and 319 in the FIG. 3 drawing while the in-phase elements 304 and 306 are fed from the top side of the two illustrated transformers.

In the transducer arrangement shown in FIG. 3, the receiving transducer 332 is shown to be a simple bar element such as has been used heretofore in the delay line art. This simple bar transducer element 332 can be replaced with a more complex and frequency compensating transducer of the type suggested at 300 in FIG. 3 when needed by the delay line response smoothing requirements. As is implied by this prospect of using a transducer of the type shown at 300 in FIG. 3, the Wilkinson combiner network is bilateral in nature and may be employed as a receiving transducer combiner or a transmitting transducer splitter at either transducer location on the delay line. A Wilkinson combiner arrangement in either the transmitting or receiving location of a delay line is found to provide two signal feeds that are well-isolated and have little crosstalk—as needed in providing the signal relationships indicated in FIG. 2. Other forms of coupling circuitry in addition to the Wilkinson Combiner arrangement are of course within the scope of the invention.

The FIG. 3 transducer arrangement also presumes the presence of a ground plane member such as was shown at 108 in FIG. 1. The common returns for the signal source 324 as indicated at 326 and for the load resistance 334 as indicated at 338 are both connected to this ground plane member.

In fabricating transducers with the mask arrangement shown in FIG. 3, it is feasible to employ a FIG. 3 type pattern as a positive photographic mask for forming conductors on a substrate such as the separation layer 106 in FIG. 1 and then place the magnetic ferrite material comprising the delay line structure, that is, the YIG film layer 104, on top of the formed transducer condutors. Additional transducer elements, that is, additional bar transducer elements or additional pairs of interdigital transducer elements or additional combinations of bar and interdigital elements may be added to either the transmitting or receiving transducers 300 and 301 as needed to obtain a desired delay line frequency vs. delay time relationship.

In FIG. 4 of the drawings there is shown at 4A a relationship between frequency and transducer response or magnetic wave generating efficiency which is descriptive of the transducer arrangement shown, for example, at 204 in FIG. 2 and at 300 in FIG. 3. FIG. 4B shows the relationship between frequency and delay for a delay line of the type shown in FIG. 1 with the scale along the axis 424 in FIG. 4B coinciding with the scale shown in FIG. 4A along the axis 406 in order that the relationship between transducer response and delay line response is discernible.

Frequency is indicated along the axis 406 in FIG. 4A in terms of wave vectors or wave numbers; a wave vector number being determined by dividing $2\pi$ by the wavelength. Wave vectors pertinent to the FIG. 4B drawing are indicated at 414 and 416 in FIG. 4A. Transducer amplitude response or efficiency is indicated along the axis 404 in FIG. 4A, while the delay time is indicated along the axis 422 in FIG. 4B.

The straight line 418 in FIG. 4B describes a desired relationship between delay line input frequency and delay time, that is, a linear relationship. The curve 420 in FIG. 4B indicates without scale the type of uncorrected relationship expected between frequency and delay in a frequency dispersive magnetostatic line; the curve 420 includes the slow W or slow S shape that is characteristic of this type of delay line. In the portions 426 and 430 of this curve, the delay attained is shorter than the desired straight line 418 delay, while in the curve portion 428 the attained delay is longer than the desired delay.

A means for tailoring the transducer response characteristics to reduce the delay errors in the portions 426, 428 and 430 is represented by the curves 408, 409, and 410 in FIG. 4A, these curves representing the response of the interdigital pair of transducer elements 202 and 203 in FIG. 2 and the bar transducer pair 200 and 202, respectively. As indicated by the relative transducer locations in FIG. 2, the shorter propagation distance for signals originating in the interdigital pair of transducer elements 202 and 203 results in a shorter delay time for signals introduced by this pair of elements, such signals being centered on the frequency $2\pi/2l_1$ as indicated at 412 in FIG. 4A. This combination of shorter propagation distance for frequencies centered on the value of $2\pi/2l_1$ indicated at 412 tends to reduce the excess delay represented by the curve portion 428 and make the curve 420 more nearly approach the desired straight line response 418, because the frequency $2\pi/2l_1$ is also the center of the excess delay portion 428 in FIG. 4B. In similar fashion, location of the bar transducer peaks 407 and 409 at frequencies corresponding to the center of the insufficient delay portions 426 and 430 in FIG. 4B, tends to increase the delay observed at these frequencies by reason of the longer propagation path imposed on signals entering the delay line by way of the transducer elements 200 and 202 in FIG. 2.

The present invention is not limited to the transducer arrangements shown in FIG. 2 and FIG. 3. In terms of the FIG. 4B relationship, the incorporation of additional transducer elements at different delay locations might, for example, be useful in shaping the delay characteristic curve near the regions of intersection between the curve 420 and the straight line 418 and thereby supplement a first attempt at delay linearizing that caused the largest remaining errors to no longer be at 426, 428 and 430, but at the intermediate crossover region areas.

The degree of linearization attainable with the frequency responsive transducer elements of FIGS. 2 and 3 is illustrated for a forward volume wave delay line in FIG. 6 of the drawings. In FIG. 6 the plot 600 represents an uncompensated delay line with actual values of radio frequency signal input frequency indicated along the axis 604 and delay time in nanoseconds indicated along the axis 608; the delay time is normalized or shown in the form of departure from a desired delay value as indicated at 610. The FIG. 6 curves represent a 20-micron thick magnetostatic film 104 and the compensated or corrected delay line response curve 602 represents correction achieved with the use of a double bar and interdigital transducer combination as indicated in FIGS. 2 and 3.

As indicated by the peak amplitudes of the curves 600 and 602, compensation in the example of FIG. 6 was effective in reducing the encountered delay errors by some 50%, that is, from errors of 2 nanoseconds to errors of about 1 nanosecond in the central passband portion of the FIG. 6 curve. Additional smoothing of the curve 602 can, of course, be obtained by tailoring the response of the transducers to slightly different peak frequencies, by adjustment of the ground plane to delay line spacing, as indicated in connection with FIG. 1, and by the addition of more delay line frequency responsive transducer elements as needed.

The effectiveness of the delay line compensation in terms of phase error measured in degrees of phase, is shown in FIG. 5 for a 50-micrometer YIG film forward volume wave delay line that was spaced 50 micrometers from a ground plane. The axis 504 in FIG. 5 represents frequency, the frequencies being in a different microwave band for the FIG. 5 drawing, while the axis 506 represents phase error measured in degrees and related to a normalized or zero degree error line 508. As indicated by the amplitude of the peaks for the curves 500 and 502, the phase error has been reduced from 31 degrees to 13 degrees by use of the compensation techniques described herein.

Figure 7:
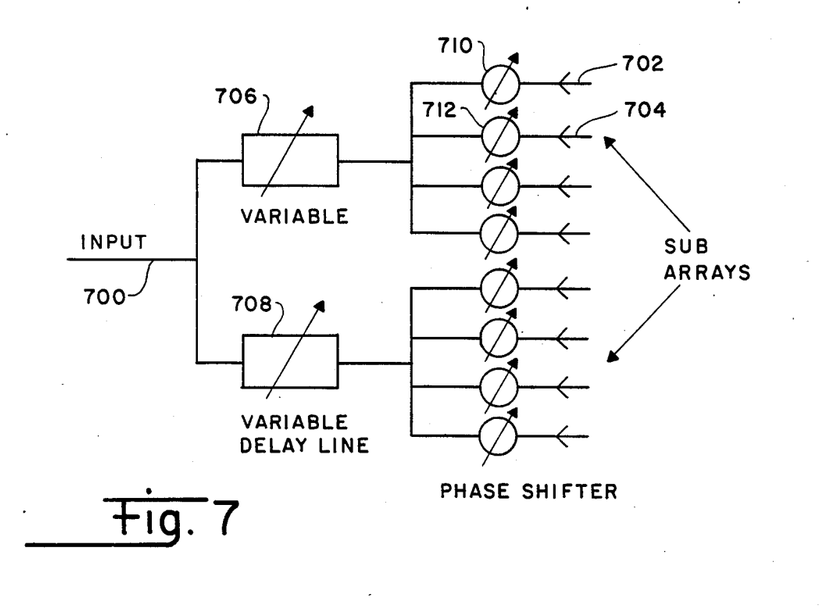
FIG. 7 shows a use of delay lines made in accordance with the invention in an antenna array.

A use of a delay line of the type described is illustrated in FIG. 7 of the drawings. In FIG. 7 the elements or subarrays of an antenna are represented as shown at 702 and 704, and are fed through the phase shifting devices as shown at 710 and 712 from the output of a pair of delay lines 706 and 708. The delay lines 706 and 708 could employ the present invention apparatus. Signal feeding the two delay lines 706 and 708 is obtained from a source of microwave radio frequency energy coupled to the input 700 in FIG. 7.

While the apparatus and method herein described constitute a preferred embodiment of the invention, it is to be understood that the invention is not limited to this precise form of apparatus or method and that changes may be made therein without departing from the scope of the invention which is defined in the appended claims.

We claim:

1. A method for linearizing the relationship between delay time and signal frequency in a dispersive magnetostatic delay line comprising the steps of:
   coupling magnetic wave inducing energy into the input end of the delay line from a plurality of transmitter transducer locations each having a different magnetic wave propagation distance from the output end of the delay line;
   proportioning the input signal energy coupling between each transmitter transducer location and the delay line in response to differences between the intrinsic and desired delay time vs. signal characteristics of the delay line, signal energy having frequency incurring excessive with respect to desired delay in the delay line being most efficiently coupled at input transducer locations closest to the output end of the delay line via an efficient coupling combination of transmitter transducer conductor spacing, current phase difference and current amplitude, and also lower efficiency coupled at input transducer locations more distal of the output end of the delay line and energy having frequency incurring smaller with respect to desired delay in the delay line being most efficiently coupled at input transducer locations more distal of the output end of the delay line via an efficient coupling combination of transmitter transducer conductor spacing, current phase difference and current amplitude and also lower efficiency coupled at input transducer locations closest to the output end of the delay line.

2. Frequency response correcting transducer apparatus for a frequency dispersive magnetostatic wave delay line comprising the combination of:
   first and second end excited magnetic wave generating conductor members magnetically coupleable with one end of a magnetostatic delay line body member and spaced apart by a first predetermined separation distance along a length dimension of said body member;
   means for separately exciting said first and second conductor members with microwave frequency currents having first and second unequal amplitudes and first angle phase relationships;
   a third end excited magnetic wave generating conductor member magnetically coupleable with said delay line body member end and spaced from one of said first and second conductor members by a second predetermined separation distance different from said first separation distance along a length dimension of said body member;
   means for exciting said third conductor member with microwave frequency current of phase and amplitude different from the current in one of said first and second conductor members;
   whereby exciting signal amplitude and phase differences and spacing variations between said conductors is determinative of coupling strength and the frequency response spectrum for said transducer apparatus.

3. Microwave apparatus comprising:
   a frequency variable source of microwave radio frequency energy signals;
   a plurality of microwave energy radiating elements located in a microwave antenna array of predetermined element size and spacing;
   a delay line body member of frequency selective magnetic wave propagating material;
   means for coupling magnetic wave inducing energy into the input end of said delay line body member including a plurality of delay line transducer elements positioned along an input end portion of said body member, said element being at a different magnetic wave propagation distance from a receiving end of said body member;
   energy coupling means for proportioning the input signal energy coupled to each said delay line input transducer element in accordance with the intrinsic delay time vs. signal frequency characteristics of said delay line, signal energy at frequencies intrinsically incurring a larger than predetermined desired delay in said delay line being most strongly coupled at input end transducer locations closest to said delay line receiving end and signal energy at frequencies intrinsically incurring a smaller than predetermined desired delay in said delay line being most strongly coupled at input end transducer locations most remote from said delay line receiving end; and means located at said delay line body receiving end for coupling microwave radio frequency energy from said body member to said antenna array radiating elements.

4. Frequency compensated magnetostatic delay line apparatus comprising:
- a magnetostatic crystal body member;
- a source of magnetic bias flux oriented in a predetermined direction with respect to said magnetostatic crystal body member;
- a plurality of end-fed electrical energy to magnetostatic wave energy transducer elements of multiple separation dimension spacings located at one end of said body member, said transducer elements comprising a frequency selective first transducer array;
- electrical energy port means for signal communication with said transducer elements; and
- electrical network energy coupling means connected between said port means and said transducer elements for determining signal phase and amplitude for each transducer element in response to a predetermined relationship between element dimensions, element signal phasing, element signal current, and transducer frequency response, said coupling means including at least first and second electrically distinguished electrical network signal paths communicating signal between said port means and selected of said transducer elements.

5. The apparatus of claim 4 wherein said transducer elements are substantially one-half-wavelength in length at a frequency in the range of said signal source means.

6. The apparatus of claim 4 further including a ground plane member and a dielectric spacer member located between said body member and said ground plane member.

7. The apparatus of claim 4 wherein said delay line body member is composed of yttrium iron garnet.

8. The apparatus of claim 7 wherein said body member is mounted on a substrate composed of gadolinium gallium garnet.

9. The apparatus of claim 4 wherein said electrical energy coupling means includes series tandem connected signal phase and amplitude determining elements in said signal paths.

10. The apparatus of claim 4 further including a frequency selective second transducer array located at the first array distal end of said body member.

11. The apparatus of claim 10 wherein one of said transducer arrays includes both bar and interdigital transducer elements.

12. The apparatus of claim 4 further including additional of said electrically distinguished signal paths each connected with elements of said transducer array.

13. The apparatus of claim 4 wherein said electrical network energy coupling means includes a Wilkinson combiner network.

14. Frequency response correcting transducer apparatus for a frequency dispersive microwave frequency magnetostatic wave delay line comprising the combination of:
- first and second end excited magnetic wave generating conductor members of an odd number of half-wavelengths length at said microwave frequency and magnetically coupleable with one end of a magnetostatic delay line body member and spaced apart by substantially one-half wavelength at said microwave frequency;
- means including a Wilkinson combiner network for separately exciting said first and second conductor members with microwave frequency currents having first and second unequal amplitudes and first angle phase relationships;
- a third end excited magnetic wave generating conductor member of an odd number of half-wavelengths length at said microwave frequency and magnetically coupleable with said delay line body member in a location closer to one end of said delay line body member than either of said first and second conductor members and spaced from said first and second conductor members by one and by one-half wavelengths, respectively, at said microwave frequency; and
- means including a Wilkinson combiner network for exciting said third conductor member with microwave frequency current of phase and amplitude different from the current in one of said first and second conductor members;
- whereby spacing difference, conductor current amplitude, and conductor current phase relationship between said conductors is determinative of transducer coupling efficiency with said body member and the frequency response spectrum of said transducer apparatus.

15. Frequency response correcting transducer apparatus for a frequency dispersive microwave frequency magnetostatic wave delay line comprising the combination of:
- first and second end excited magnetic wave generating conductor members magnetically coupleable with one end of a magnetostatic delay line body member and spaced apart by substantially one-half wavelength at said microwave frequency;
- means for separately exciting said first and second conductor members with microwave frequency currents having first and second unequal amplitudes and first angle phase relationships;
- a third end excited magnetic wave generating conductor member magnetically coupleable with said delay line body member in a location closer to one end of said delay line body member than either of said first and second conductor members; and
- means for exciting said third conductor member with microwave frequency current of phase and amplitude different from the current in one of said first and second conductor members;
- whereby spacing difference, conductor current amplitude, and conductor current phase relationship between said conductors is determinative of transducer coupling efficiency with said body member and the frequency response spectrum of said transducer apparatus.

16. The apparatus of claim 15 wherein said second predetermined separation distance spacing between said third conductor and the most adjacent of said first and second conductors is substantially one-half wavelength at said microwave radio frequency.

* * * * *